US012579026B2

(12) United States Patent
Ayyapureddi

(10) Patent No.: US 12,579,026 B2
(45) Date of Patent: Mar. 17, 2026

(54) APPARATUSES, SYSTEMS, AND METHODS FOR STORING MEMORY METADATA IN A GLOBAL COLUMN REDUNDANCY PLANE

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 18/431,306

(22) Filed: Feb. 2, 2024

(65) Prior Publication Data

US 2024/0272979 A1      Aug. 15, 2024

Related U.S. Application Data

(60) Provisional application No. 63/484,042, filed on Feb. 9, 2023.

(51) Int. Cl.
　　*G06F 11/00*　　　　(2006.01)
　　*G06F 11/10*　　　　(2006.01)
　　　　　　(Continued)

(52) U.S. Cl.
　　CPC ...... *G06F 11/1004* (2013.01); *G06F 11/1048* (2013.01); *G11C 29/24* (2013.01); *G11C 29/26* (2013.01); *G11C 29/42* (2013.01)

(58) Field of Classification Search
　　CPC ............. G06F 11/1004; G06F 11/1008; G06F 11/1048; G11C 29/24; G11C 29/26; G11C 29/42; G11C 29/44
　　See application file for complete search history.

(56) References Cited

U.S. PATENT DOCUMENTS

| | | | |
|---|---|---|---|
| 5,177,705 A | 1/1993 | Mcelroy et al. | |
| 5,299,164 A | 3/1994 | Takeuchi et al. | |

(Continued)

FOREIGN PATENT DOCUMENTS

| | | | |
|---|---|---|---|
| WO | 2016048634 A1 | 3/2016 | |
| WO | 2024107367 A1 | 5/2024 | |

(Continued)

OTHER PUBLICATIONS

Chen et al., "CATCAM: Constant-time Alteration Ternary CAM with Scalable In-Memory Architecture"; 2020 53rd Annual IEEE/ACM International Symposium on Microarchitecture (MICRO), Athens, Green; Oct. 17-21, 2020; pp. 342-355.

(Continued)

*Primary Examiner* — Justin R Knapp
(74) *Attorney, Agent, or Firm* — Dorsey & Whitney LLP

(57) ABSTRACT

A bank of a memory device may be divided into column planes. Each column plane may be associated with column selects. In some examples, a portion of a column plane associated with one column select may be used to store metadata associated with data of the remaining column selects. In some examples, the metadata may be mapped to the data based on a portion of a column address. In some examples, whether the memory device provides metadata responsive to a column address may be based on a value stored in a mode register. In some examples, the portion of the column plane associated with the one column select associated with metadata may also store error correction code data associated with the data of the remaining column selects.

8 Claims, 6 Drawing Sheets

(51) Int. Cl.
    *G11C 29/24*     (2006.01)
    *G11C 29/26*     (2006.01)
    *G11C 29/42*     (2006.01)

(56) References Cited

U.S. PATENT DOCUMENTS

| | | | |
|---|---|---|---|
| 5,434,814 A | 7/1995 | Cho et al. | |
| 6,249,476 B1 | 6/2001 | Yamazaki et al. | |
| 7,117,421 B1 * | 10/2006 | Danilak | G06F 11/1008 |
| | | | 714/763 |
| 8,891,313 B2 | 11/2014 | Chang et al. | |
| 9,158,617 B2 | 10/2015 | Cho et al. | |
| 9,195,537 B2 | 11/2015 | Sharon et al. | |
| 9,201,728 B2 | 12/2015 | Patapoutian et al. | |
| 9,361,960 B2 | 6/2016 | Vogelsang | |
| 9,547,550 B1 | 1/2017 | Thakore et al. | |
| 9,607,679 B1 | 3/2017 | Kim et al. | |
| 9,666,291 B2 | 5/2017 | Park | |
| 9,880,901 B2 | 1/2018 | Zastrow | |
| 9,996,799 B2 | 6/2018 | Bostick et al. | |
| 10,127,101 B2 | 11/2018 | Halbert et al. | |
| 10,222,989 B1 | 3/2019 | Zitlaw | |
| 10,243,590 B1 | 3/2019 | Seshadri | |
| 10,810,079 B2 | 10/2020 | Halbert et al. | |
| 10,817,371 B2 | 10/2020 | Rooney et al. | |
| 10,872,011 B2 | 12/2020 | Bains et al. | |
| 10,929,033 B2 | 2/2021 | Meeker et al. | |
| 10,937,517 B1 | 3/2021 | Rich-Plotkin et al. | |
| 10,963,336 B2 | 3/2021 | Veches | |
| 11,010,304 B2 | 5/2021 | Kang et al. | |
| 11,074,126 B2 | 7/2021 | Prather et al. | |
| 11,088,710 B2 | 8/2021 | Lee et al. | |
| 11,177,012 B1 | 11/2021 | Avraham et al. | |
| 11,200,961 B1 | 12/2021 | Uribe | |
| 11,264,085 B1 | 3/2022 | Ware et al. | |
| 11,538,515 B2 | 12/2022 | Ji et al. | |
| 11,579,971 B2 | 2/2023 | Ayyapureddi | |
| 11,580,038 B2 | 2/2023 | Norman et al. | |
| 11,615,861 B2 | 3/2023 | Kim et al. | |
| 12,001,707 B2 | 6/2024 | Boehm et al. | |
| 12,014,797 B2 | 6/2024 | Ayyapureddi | |
| 12,019,513 B2 | 6/2024 | Ayyapureddi | |
| 12,095,474 B1 | 9/2024 | Zhu et al. | |
| 12,204,410 B2 | 1/2025 | Sutera et al. | |
| 12,204,770 B2 | 1/2025 | Ayyapureddi | |
| 12,230,347 B2 | 2/2025 | Suh et al. | |
| 12,249,393 B2 | 3/2025 | Reohr | |
| 2003/0081492 A1 | 5/2003 | Farrell et al. | |
| 2003/0117838 A1 | 6/2003 | Hidaka | |
| 2006/0233030 A1 | 10/2006 | Choi | |
| 2008/0089129 A1 | 4/2008 | Lee | |
| 2008/0313493 A1 | 12/2008 | Roohparvar et al. | |
| 2009/0097348 A1 | 4/2009 | Minzoni et al. | |
| 2009/0132876 A1 | 5/2009 | Freking et al. | |
| 2009/0168523 A1 | 7/2009 | Shirakawa et al. | |
| 2009/0196103 A1 | 8/2009 | Kim et al. | |
| 2010/0177582 A1 | 7/2010 | Kim et al. | |
| 2010/0177587 A1 | 7/2010 | Huang | |
| 2010/0290146 A1 | 11/2010 | Lam | |
| 2011/0154158 A1 | 6/2011 | Yurzola et al. | |
| 2012/0092940 A1 | 4/2012 | Chang et al. | |
| 2013/0117630 A1 | 5/2013 | Kang | |
| 2014/0126300 A1 | 5/2014 | Takahashi et al. | |
| 2015/0193464 A1 | 7/2015 | Kwon et al. | |
| 2015/0262631 A1 | 9/2015 | Shimizu | |
| 2016/0070507 A1 | 3/2016 | Hoshikawa et al. | |
| 2016/0092307 A1 | 3/2016 | Bonen et al. | |
| 2016/0125920 A1 | 5/2016 | Kim et al. | |
| 2016/0307645 A1 | 10/2016 | Kim et al. | |
| 2017/0060681 A1 | 3/2017 | Halbert et al. | |
| 2017/0062067 A1 | 3/2017 | Yang et al. | |
| 2017/0091025 A1 | 3/2017 | Ahn et al. | |
| 2017/0192843 A1 | 7/2017 | Warnes et al. | |
| 2017/0249097 A1 | 8/2017 | Eguchi | |
| 2017/0269992 A1 | 9/2017 | Bandic et al. | |
| 2017/0285990 A1 | 10/2017 | Chen et al. | |
| 2017/0286213 A1 | 10/2017 | Li | |
| 2017/0344423 A1 | 11/2017 | Hsiao et al. | |
| 2018/0025760 A1 | 1/2018 | Mazumder et al. | |
| 2018/0121283 A1 | 5/2018 | Plants | |
| 2018/0150350 A1 | 5/2018 | Cha et al. | |
| 2018/0301203 A1 | 10/2018 | Kim | |
| 2019/0066816 A1 | 2/2019 | Dono | |
| 2019/0073261 A1 | 3/2019 | Halbert et al. | |
| 2019/0103154 A1 | 4/2019 | Cox et al. | |
| 2019/0197171 A1 | 6/2019 | Tiwari et al. | |
| 2019/0206478 A1 | 7/2019 | Jun | |
| 2019/0362792 A1 | 11/2019 | Oh et al. | |
| 2019/0369893 A1 | 12/2019 | Ross | |
| 2019/0371403 A1 | 12/2019 | Maejima | |
| 2020/0019462 A1 | 1/2020 | Prather et al. | |
| 2020/0051616 A1 | 2/2020 | Cho | |
| 2020/0104205 A1 | 4/2020 | Noguchi et al. | |
| 2020/0104208 A1 | 4/2020 | Heo et al. | |
| 2020/0194050 A1 | 6/2020 | Akamatsu | |
| 2020/0226039 A1 | 7/2020 | Lee | |
| 2020/0321060 A1 | 10/2020 | Lang et al. | |
| 2020/0373941 A1 | 11/2020 | Latorre et al. | |
| 2021/0011645 A1 | 1/2021 | Martinelli et al. | |
| 2021/0012817 A1 | 1/2021 | Laurent et al. | |
| 2021/0012849 A1 | 1/2021 | Kim et al. | |
| 2021/0057003 A1 | 2/2021 | Prather et al. | |
| 2021/0064119 A1 | 3/2021 | Mirichigni et al. | |
| 2021/0064282 A1 | 3/2021 | He et al. | |
| 2021/0064461 A1 | 3/2021 | Veches | |
| 2021/0064467 A1 | 3/2021 | Buerkle et al. | |
| 2021/0083687 A1 | 3/2021 | Lee et al. | |
| 2021/0142848 A1 | 5/2021 | Lim et al. | |
| 2021/0142860 A1 | 5/2021 | Song et al. | |
| 2021/0200630 A1 | 7/2021 | Ishikawa et al. | |
| 2021/0208967 A1 | 7/2021 | Cha et al. | |
| 2021/0224155 A1 | 7/2021 | Bains et al. | |
| 2021/0247910 A1 | 8/2021 | Kim et al. | |
| 2021/0272627 A1 | 9/2021 | Lee | |
| 2021/0294692 A1 | 9/2021 | Chen | |
| 2021/0311821 A1 | 10/2021 | Ryu et al. | |
| 2021/0311822 A1 | 10/2021 | Jannusch et al. | |
| 2021/0311830 A1 | 10/2021 | Lee | |
| 2021/0357287 A1 * | 11/2021 | Kim | H03M 13/1575 |
| 2021/0358559 A1 | 11/2021 | Suh et al. | |
| 2021/0365316 A1 | 11/2021 | Nale et al. | |
| 2021/0406123 A1 | 12/2021 | Nakanishi et al. | |
| 2022/0027090 A1 | 1/2022 | Kwon et al. | |
| 2022/0035529 A1 | 2/2022 | Bennett | |
| 2022/0084565 A1 | 3/2022 | Prather et al. | |
| 2022/0091938 A1 | 3/2022 | Buerkle et al. | |
| 2022/0129196 A1 | 4/2022 | Roberts et al. | |
| 2022/0138065 A1 | 5/2022 | Secatch et al. | |
| 2022/0197739 A1 | 6/2022 | Ryu et al. | |
| 2022/0261310 A1 | 8/2022 | Ishikawa et al. | |
| 2022/0334917 A1 | 10/2022 | Veches | |
| 2022/0337271 A1 | 10/2022 | Hanna | |
| 2022/0365692 A1 | 11/2022 | Vankamamidi et al. | |
| 2022/0398042 A1 | 12/2022 | Song et al. | |
| 2022/0415398 A1 | 12/2022 | Lien et al. | |
| 2023/0146549 A1 | 5/2023 | Lien et al. | |
| 2023/0161665 A1 | 5/2023 | Choi et al. | |
| 2023/0185665 A1 | 6/2023 | Ayyapureddi | |
| 2023/0223096 A1 | 7/2023 | Bains et al. | |
| 2023/0236747 A1 | 7/2023 | Curewitz et al. | |
| 2023/0289072 A1 | 9/2023 | Cho et al. | |
| 2023/0298682 A1 | 9/2023 | Suh et al. | |
| 2023/0350581 A1 | 11/2023 | Ayyapureddi | |
| 2023/0350748 A1 | 11/2023 | Ayyapureddi | |
| 2023/0352064 A1 | 11/2023 | Ayyapureddi | |
| 2023/0352112 A1 | 11/2023 | Ayyapureddi | |
| 2024/0004754 A1 | 1/2024 | Veches | |
| 2024/0079074 A1 | 3/2024 | Bak et al. | |
| 2024/0086520 A1 | 3/2024 | Kaplan et al. | |
| 2024/0096404 A1 | 3/2024 | Cho et al. | |
| 2024/0126438 A1 | 4/2024 | Suh et al. | |
| 2024/0160351 A1 | 5/2024 | Ayyapureddi et al. | |
| 2024/0160524 A1 | 5/2024 | Ayyapureddi et al. | |
| 2024/0160527 A1 | 5/2024 | Ayyapureddi et al. | |

(56) References Cited

U.S. PATENT DOCUMENTS

| | | | |
|---|---|---|---|
| 2024/0161855 A1 | 5/2024 | Smith et al. | |
| 2024/0161856 A1 | 5/2024 | Smith et al. | |
| 2024/0161859 A1 | 5/2024 | Ayyapureddi et al. | |
| 2024/0170088 A1 | 5/2024 | Smith et al. | |
| 2024/0176699 A1 | 5/2024 | Ayyapureddi et al. | |
| 2024/0177794 A1 | 5/2024 | Vogelsang | |
| 2024/0220142 A1 | 7/2024 | Park | |
| 2024/0220149 A1 | 7/2024 | Kim et al. | |
| 2024/0248796 A1 | 7/2024 | Ayyapureddi | |
| 2024/0256380 A1* | 8/2024 | Ayyapureddi | ...... G06F 11/1048 |
| 2024/0256382 A1 | 8/2024 | Ayyapureddi | |
| 2024/0272984 A1 | 8/2024 | Ayyapureddi | |
| 2024/0273014 A1 | 8/2024 | Ayyapureddi | |
| 2024/0274223 A1 | 8/2024 | Ayyapureddi | |
| 2024/0281327 A1 | 8/2024 | Ayyapureddi et al. | |
| 2024/0289266 A1 | 8/2024 | Ayyapureddi | |
| 2024/0321328 A1 | 9/2024 | Ayyapureddi | |
| 2024/0377952 A1 | 11/2024 | Song et al. | |
| 2024/0394178 A1 | 11/2024 | Partsch | |
| 2024/0419538 A1 | 12/2024 | Huang et al. | |
| 2025/0077103 A1 | 3/2025 | Ayyapureddi | |
| 2025/0077424 A1 | 3/2025 | Ayyapureddi | |
| 2025/0078906 A1 | 3/2025 | Kim et al. | |
| 2025/0078949 A1 | 3/2025 | Ayyapureddi | |
| 2025/0078950 A1 | 3/2025 | Ayyapureddi | |
| 2025/0110643 A1 | 4/2025 | Ayyapureddi | |
| 2025/0110825 A1 | 4/2025 | Ayyapureddi | |
| 2025/0110830 A1 | 4/2025 | Ayyapureddi | |
| 2025/0111887 A1 | 4/2025 | Ayyapureddi | |
| 2025/0112643 A1 | 4/2025 | Ayyapureddi | |
| 2025/0123924 A1 | 4/2025 | Ayyapureddi et al. | |
| 2025/0138940 A1 | 5/2025 | Cho et al. | |
| 2025/0156087 A1 | 5/2025 | Ayyapureddi | |

FOREIGN PATENT DOCUMENTS

| | | | |
|---|---|---|---|
| WO | 2024107503 A1 | 5/2024 | |
| WO | 2024107504 A1 | 5/2024 | |
| WO | 2024167711 A1 | 8/2024 | |
| WO | 2025053912 A1 | 3/2025 | |
| WO | 2025075696 A1 | 4/2025 | |
| WO | 2025075697 A1 | 4/2025 | |

OTHER PUBLICATIONS

J. F. Philippe Marchand "An Alterable Programmable Logic Array"; IEEE Journal of Solid-State Circuits, vol. sc-20, No. 5, Oct. 1985; pp. 1061-1066.

U.S. Appl. No. 18/441,775 titled "Apparatuses and Methods for Settings for Adjustable Write Timing" filed Feb. 14, 2024, pp. all pages of the application as filed.

U.S. Appl. No. 18/441,830 titled "Apparatuses, Systems, and Methods for Storing and Accessing Memory Metadata and Error Correction Code Data" filed Feb. 14, 2024, pp. all pages of the application as filed.

PCT Application No. PCT/US24/39192 titled "Apparatuses and Methods for Scalable 1-Pass Error Correction Code Operations" filed Jul. 23, 2024, pp. all pages of the application as filed.

PCT Application No. PCT/US24/39195 titled "Apparatuses and Methods for Half-Page Modes of Memory Devices" filed Jul. 23, 2024, pp. all pages of the application as filed.

PCT Application No. PCT/US24/39231 titled "Apparatuses and Methods for Granular Single-Pass Metadata Access Operations" filed Jul. 24, 2024, pp. all pages of the application as filed.

U.S. Appl. No. 18/734,189, titled "Apparatuses, Systems, and Methods for Managing Metadata Storage at a Memory" filed Jun. 5, 2024, pp. all pages of application as filed.

U.S. Appl. No. 18/743,994 titled "Apparatuses and Methods for Shared Codeword in 2-Pass Access Operations" filed Jun. 14, 2024, pp. all pages of the application as filed.

U.S. Appl. No. 18/745,577 titled "Apparatuses and Methods for Half-Page Modes of Memory Devices" filed Jun. 17, 2024, pp. all pages of the application as filed.

U.S. Appl. No. 18/745,843 titled "Apparatuses and Methods for Half-Page Modes of Memory Devices" filed Jun. 17, 2024, pp. all pages of the application as filed.

U.S. Appl. No. 18/745,877 titled "Apparatuses and Methods for Half-Page Modes of Memory Devices" filed Jun. 17, 2024, pp. all pages of the application as filed.

U.S. Appl. No. 18/745,894 titled "Apparatuses and Methods for Half-Page Modes of Memory Devices" filed Jun. 17, 2024, pp. all pages of the application as filed.

U.S. Appl. No. 18/747,658, titled "Apparatuses and Methods for Bounded Fault Compliant Metadata Storage" filed, pp. all pages of application as filed.

U.S. Appl. No. 18/747,676, titled "Apparatuses and Methods for Alternate Memory Die Metadata Storage", filed Jun. 19, 2024, pp. all pages of application as filed.

U.S. Appl. No. 18/747,696, titled "Apparatuses and Methods for Scalable 1-Pass Error Correction Code Operations", filed Jun. 19, 2024, pp. all pages of application as filed.

U.S. Appl. No. 18/747,712, titled "Apparatuses and Methods for Granular Single-Pass Metadata Access Operations" filed Jun. 19, 2024, pp. all pages of application as filed.

U.S. Appl. No. 18/747,635, titled "Apparatuses and Methods for Read/Modify/Writemetadata Access Operations" filed Jun. 19, 2024, pp. all pages of application as filed.

PCT Application No. PCT/US23/76430 titled "Apparatuses and Methods for Separate Write Enable for Single-Pass Access of Data, Metadata, and Parity Information" filed Oct. 10, 2023, pp. all pages of application as filed.

PCT Application No. PCT/US23/76433 titled "Apparatuses and Methods for Single-Pass Access of ECC Information, Metadata Information or Combinations Thereof" filed Oct. 10, 2023; pp. all pages of application as filed.

PCT Application No. PCT/US24/13516, titled "Apparatuses, Systems, and Methods for Storing Memory Metadata" filed Jan. 30, 2024; pp. all pages of application as filed.

U.S. Appl. No. 17/730,381, titled "Apparatuses, Systems, and Methods for Per Row Error Scrub Information", filed Apr. 27, 2022; pp. all pages of application as filed.

U.S. Appl. No. 17/731,024, titled "Apparatuses, Systems, and Methods for Managing Metadata Storage at a Memory", filed Apr. 27, 2022; pp. all pages of the application as filed.

U.S. Appl. No. 18/424,282 titled "Apparatuses and Methods for Bounded Fault Compliant Metadata Storage" filed Jan. 26, 2024; pp. all pages of application as filed.

U.S. Appl. No. 18/424,342 titled "Apparatuses and Methods for Bounded Fault Compliant Metadata Storage" filed Jan. 26, 2024; pp. all pages of application as filed.

U.S. Appl. No. 18/430,381, titled "Apparatuses, Systems, and Methods for Storing Memory Metadata", filed Feb. 1, 2024; pp. all pages of application as filed.

U.S. Appl. No. 18/430,406, titled "Apparatuses, Systems, and Methods for Storing Memory Metadata", filed Feb. 1, 2024; pp. all pages of application as filed.

U.S. Appl. No. 18/431,232, titled "Apparatuses, Systems, and Methods for Storing Memory Metadata", filed Feb. 2, 2024; pp. all pages of application as filed.

U.S. Appl. No. 18/431,306, titled "Apparatuses, Systems, and Methods for Storing Memory Metadata", filed Feb. 2, 2024; pp. all pages of application as filed.

U.S. Appl. No. 18/504,215 titled "Apparatuses and Methods for Enhanced Metadata Support" filed Nov. 8, 2023; pp. all pages of application as filed.

U.S. Appl. No. 18/504,234 titled "Apparatuses and Methods for Enhanced Metadata Support" filed Nov. 8, 2023; pp. all pages of application as filed.

U.S. Appl. No. 18/504,316 titled "Apparatuses and Methods for Configurable ECC Modes" filed Nov. 8, 2023; all pages of application as filed.

U.S. Appl. No. 18/504,324 titled "Apparatuses and Methods for Single-Pass Access of ECC Information, Metadata Information or Combinations Thereof", filed Nov. 8, 2023, all pages of application as filed.

(56)         References Cited

OTHER PUBLICATIONS

U.S. Appl. No. 18/504,342 titled "Apparatuses and Methods for Single-Pass Access of ECC Information, Metadata Information or Combinations Thereof" filed Nov. 8, 2023; pp. all pages of application as filed.

U.S. Appl. No. 18/504,353 titled "Apparatuses and Methods for Separate Write Enable for Single-Pass Accessof Data, Metadata, and Parity Information" filed Nov. 8, 2023; pp. all pages of application as filed.

U.S. Appl. No. 18/504,362 titled "Apparatuses and Methods for Separate Write Enable for Single-Pass Access of Data, Metadata, and Parity Information" filed Nov. 8, 2023; pp. all pages of application as filed.

U.S. Appl. No. 17/730,396, titled "Apparatuses, Systems, and Methods for Per Row Error Scrub Information Registers", filed Apr. 27, 2022; pp. all pages of application as filed.

U.S. Appl. No. 17/730,992 titled "Mode Register for Blocking Direct Access to Meta Data" filed Apr. 27, 2022, pp. all pages of application as filed.

U.S. Appl. No. 17/730,992 titled "Apparatuses, Systems, and Methods for Managing Metadata Security and Access" filed Apr. 27, 2022, Kne.

U.S. Appl. No. 17/731,024 titled "Apparatuses, Systems, and Methods for Managing Metadata Storage at a Memory" filed Apr. 27, 2022, Kne.

U.S. Appl. No. 18/625,539, titled "Apparatuses, Systems, and Methods for Per Row Error Scrub Information" filed Apr. 3, 2024, pp. all pages of application as filed.

U.S. Appl. No. 19/025,934, titled "Apparatuses, Systems, and Methods for Managing Metadata Security and Access" filed Jan. 16, 2025, pp. all pages of application as filed.

Lumenci Team "High Bandwidth Memory (HBM3)" https://lumenci.com/blogs/high-bandwidth-memory; Editorial Team at Lumenci, Jul. 14, 2022; pp. 1-3.

U.S. Appl. No. 19/360,159 titled "Apparatuses and Methods for Enhanced Metadata Support" filed Oct. 16, 2025; pp. all pages of the application as filed.

U.S. Appl. No. 19/366,908 titled "Apparatuses and Methods for Configurable Ecc Modes", filed Oct. 23, 2025; pp. all pages of application as filed.

U.S. Appl. No. 19/376,027 titled "Apparatuses and Methods for Single-Pass Access of Ecc Information, Metadata Information or Combinations Thereof", filed Oct. 31, 2025; pp. all pages of application as filed.

U.S. Appl. No. 19/381,448 titled "Apparatuses and Methods for Enhanced Metadata Support", filed Nov. 6, 2025; pp. all pages of application as filed.

U.S. Appl. No. 19/431,541, titled "Apparatuses And Methods For Bounded Fault Compliant Metadata Storage" filed Dec. 23, 2025, pp. all pages of application as filed.

U.S. Appl. No. 19/435,124 titled "Apparatuses, Systems, and Methods for Storing Memory Metadata", filed Dec. 29, 2025; pp. all page of the application as filed.

U.S. Appl. No. 19/441,648, titled "Apparatuses, Systems, and Methods for Storing and Accessing Memory Metadata and Error Correction Code Data" filed Jan. 6, 2026; pp. all pages of application as filed.

Handy, Jim, "Emerging Memories Today: Understanding Bit Selectors", The Memory Guy Blog, Objective Analysis on Semiconductor Memories, Nov. 2018, 5 pgs.

* cited by examiner

| Column Addresses (CA) | | RCS Storing MD | Location in RCS of MD Bit | CS of Data | | RCS and Location of MD Bit | |
|---|---|---|---|---|---|---|---|
| Start | End | Col Plane | MD Bit | Start CS | End CS | Start RCS<Bit> | End RCS<Bit> |
| 000 000 | 000 111 | Addr<9:7> | Addr<6:4> | 0 | 7 | 0[0] | 0[7] |
| 001 000 | 001 111 | Addr<9:7> | Addr<6:4> | 8 | 15 | 1[0] | 1[7] |
| 010 000 | 010 111 | Addr<9:7> | Addr<6:4> | 16 | 23 | 2[0] | 2[7] |
| 011 000 | 011 111 | Addr<9:7> | Addr<6:4> | 24 | 31 | 3[0] | 3[7] |
| 100 000 | 100 111 | Addr<9:7> | Addr<6:4> | 32 | 39 | 4[0] | 4[7] |
| 101 000 | 101 111 | Addr<9:7> | Addr<6:4> | 40 | 47 | 5[0] | 5[7] |
| 110 000 | 110 111 | Addr<9:7> | Addr<6:4> | 48 | 55 | 6[0] | 6[7] |
| 111 000 | 110 110 | Addr<9:7> | Addr<6:4> | 56 | 63 | 7[0] | 7[7] |

Metadata Address

CA<9:4>

400

402

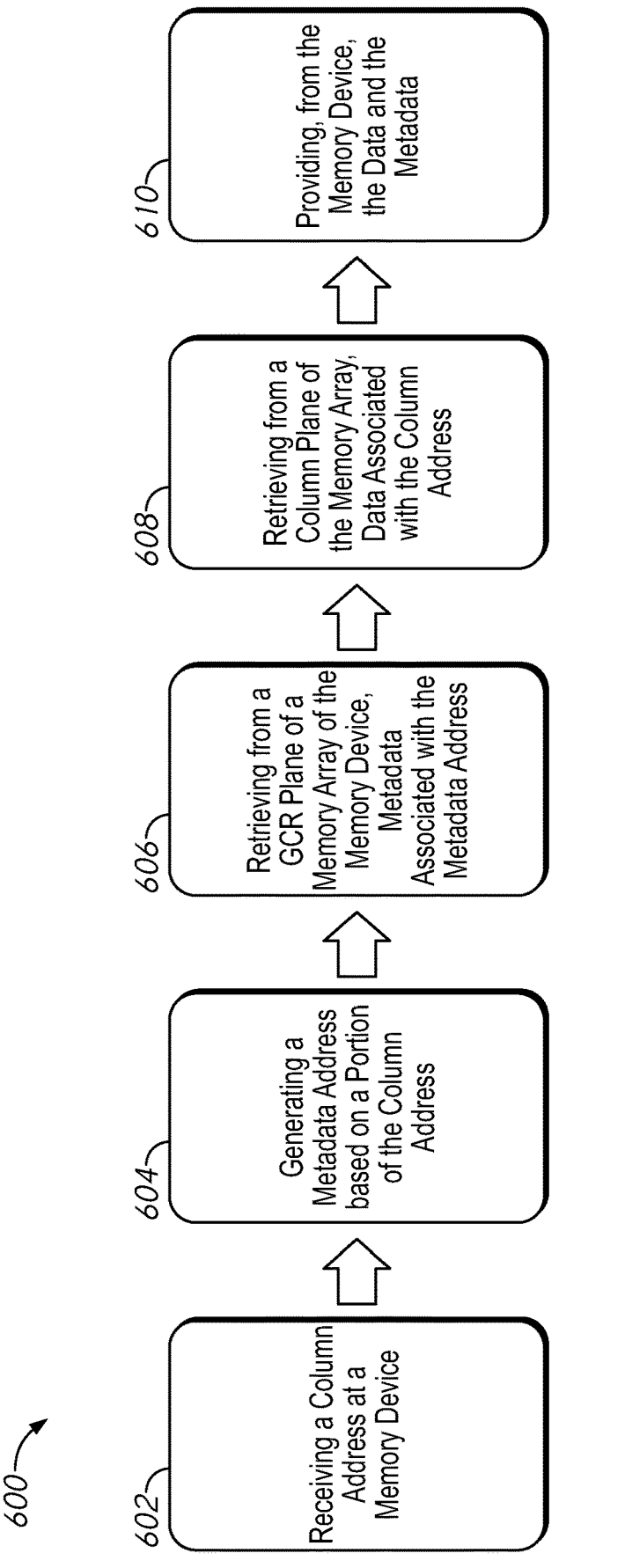

602 — Receiving a Column Address at a Memory Device

604 — Generating a Metadata Address based on a Portion of the Column Address

606 — Retrieving from a GCR Plane of a Memory Array of the Memory Device, Metadata Associated with the Metadata Address 608 — Retrieving from a Column Plane of the Memory Array, Data Associated with the Column Address 610 — Providing, from the Memory Device, the Data and the Metadata

APPARATUSES, SYSTEMS, AND METHODS FOR STORING MEMORY METADATA IN A GLOBAL COLUMN REDUNDANCY PLANE

CROSS-REFERENCE TO RELATED APPLICATIONS

This application claims the filing benefit of U.S. Provisional Application No. 63/484,042, filed Feb. 9, 2023. This application is incorporated by reference herein in its entirety and for all purposes.

BACKGROUND

This disclosure relates generally to semiconductor devices, and more specifically to semiconductor memory devices. In particular, the disclosure relates to memory, such as dynamic random access memory (DRAM). Information may be stored in memory cells, which may be organized into rows (word lines) and columns (bit lines) of an array. Various types of information may be stored in the array, such as data, error correction code (ECC) data, and metadata. The ECC data may provide information that may be used to detect and/or correct errors in the data. The metadata may provide information about the regular data, ECC data, the memory device, and/or a device in communication with the memory device (e.g., a controller).

While demand for metadata has increased, many DRAM users are sensitive to losing array space for storing user data. Accordingly, techniques for efficiently storing metadata to preserve array space for user data is desired.

BRIEF DESCRIPTION OF THE DRAWINGS

FIG. 6 is a flow chart of a method according to an embodiment of the present disclosure.

DETAILED DESCRIPTION

Figure 1:
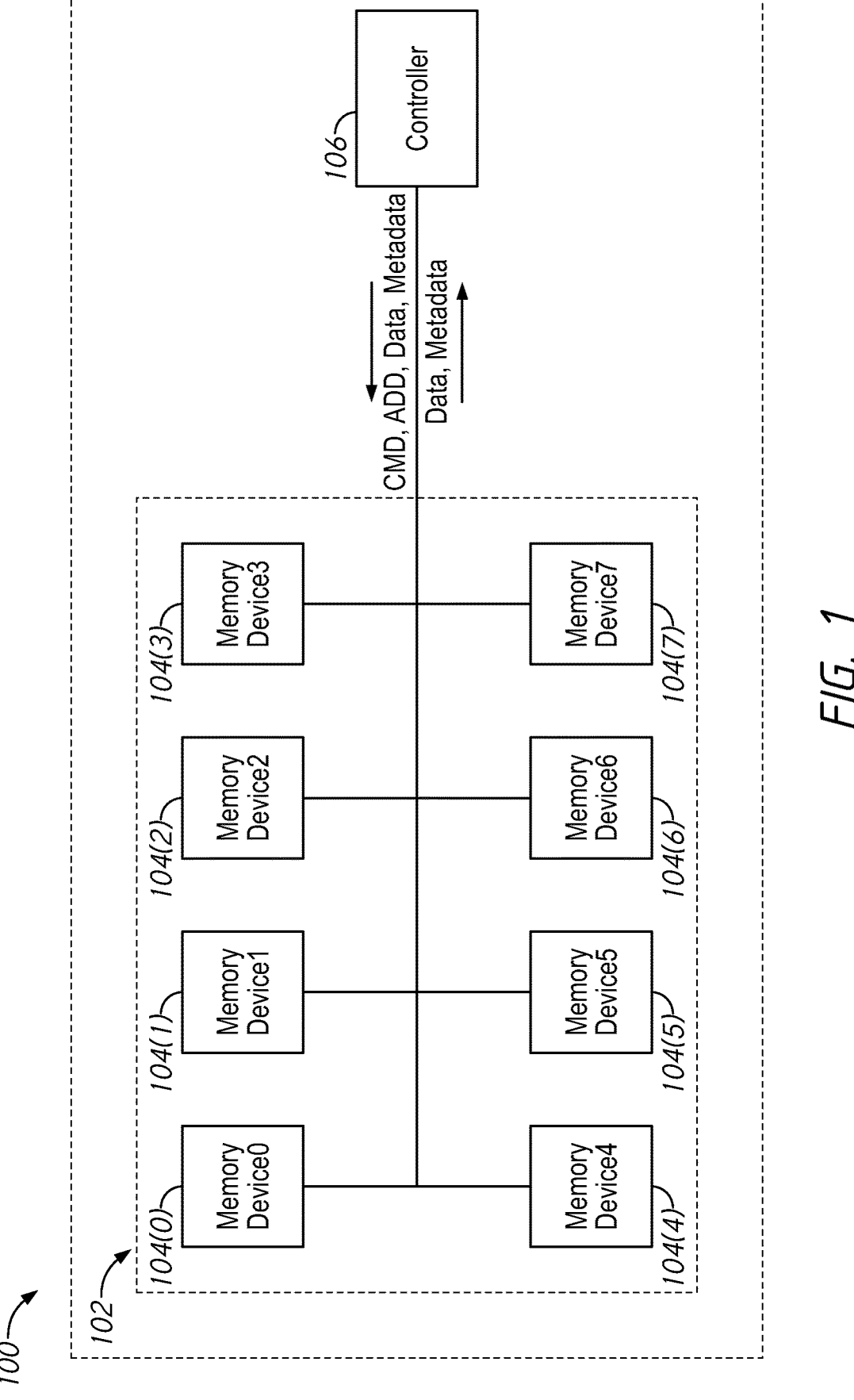
FIG. 1 is a block diagram of at least a portion of a computing system according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store information in multiple memory cells. The information may be stored as a binary code, and each memory cell may store a single bit of information as either a logical high (e.g., a "1") or a logical low (e.g., a "0"). The memory cells may be organized at the intersection of word lines (rows) and bit lines (columns) an array. The memory may further be organized into one or more memory banks. The banks may be organized into bank groups, where each bank group includes one or more banks. Each bank may include multiple of rows and columns. During operations, the memory device may receive a command and an address which specifies one or more rows and one or more columns and then execute the command on the memory cells at the intersection of the specified rows and columns (and/or along an entire row/column). The address may further specify the bank group and/or bank for execution of the command. In some applications, rows may be specified by 17-bit row addresses and columns may be specified by 10-bit column addresses. However, the number of bits used for the addresses may vary depending on the size and/or organization of the memory.

The columns may generally be organized into column planes, each of which includes a number of sets of individual columns all activated by a column select signal (CS). Each bank may include some number X column planes. In some applications, all of the column planes may be used for storing data. In some applications, some column planes may be used for other purposes, such as for storing error correction code (ECC) data and/or being held in "reserve" for redundancy. A column plane may receive some number N of column select (CS) signals, each of which may activate some number M of individual bit lines. As used herein, a column select set or CS set may generally refer to a set of bit lines which are activated by a given value of the CS signal within a column plane. The column select signal may be represented by (all or a portion of) a column address (CA). Responsive to a column select signal, data may be provided from corresponding locations from the column planes. The data from the column planes associated with the column select signal may be referred to as a cache line or prefetch.

In some embodiments, each bank of a memory array may include seventeen (X=17) column planes. In some embodiments, sixteen (16) column planes may be designated for data and one column plane may be designated for ECC data. Each column plane may receive sixty-four (N=64) CS signals, each of which may activate eight (M=8) bit lines. When a column select is activated, each column plane may provide eight bits, resulting in a prefetch of 128 bits (e.g., 8 bits×16 column planes), for example when operating in x4 mode. Optionally, in some embodiments, one or more banks may include an additional column plane (X=18) for redundancy, which may be used for repairs, but the bits from the redundant column plane "replace" the bits from a damaged column plane, resulting in the same prefetch. In embodiments where the memory array includes an additional column plane for ECC data, the memory array may provide the prefetch or cache line of data plus 8 bits of additional ECC data.

In some embodiments, one or more banks may include an additional column plane for redundancy (e.g., X=18). This additional plane, referred to as a global column redundancy (GCR) plane, may be used to repair columns of other column planes. For example, when one or more columns of a column plane are defective, repair circuitry may remap addresses of the defective columns to columns in the GCR plane. In some embodiments, the GCR plane may be smaller than a "regular" column plane. In some embodiments, the GCR plane may include fewer columns and/or receive fewer column select signals. In some applications, the GCR plane may only be capable of repairing one column of a column plane. For example, if the column associated with column select (CS) 32 is defective in two column planes, only one the two columns can be repaired by the GCR plane. However, in other applications, the GCR plane may have different capabilities or limitations.

DRAM users are increasingly utilizing metadata to supplement the data stored in the memory array. For example, metadata may be used to store a "poison bit" that indicates that the data associated with the metadata is erroneous and should be discarded and/or replaced by an external device (e.g., controller, host, and/or system on a chip). In another example, metadata may store a pointer to a storage location that may allow the external device to determine what location in the array to access the next associated data. In some applications, this may be analogous to a head and/or tail of a linked list. These are merely examples, and other uses of metadata are also possible.

While users are finding more applications for metadata, metadata must be stored somewhere on the memory device, typically in the memory array. Some users are sensitive to losing space to store "regular" user data in order to store metadata. These users may want to give up as little array density as possible while still utilizing metadata. In some applications, the user may only desire four bits of metadata, even for modules including eight DRAM devices. Further, addressing the metadata must be efficient to avoid increasing the time between an internal read and when the data is provided from the array (tAA).

According to embodiments of the present disclosure, eight columns of a GCR plane of a bank of a memory array may be used to store metadata associated with data stored in other column planes of the bank. In some embodiments, the eight column may be existing columns of the GCR plane. In other embodiments, the eight columns may be added to the GCR plane. That is, the GCR according to embodiments disclosed herein may be larger than typical GCR planes. According to embodiments of the present disclosure, each column may receive a column select signal (also referred to as simply column select). The metadata may be mapped to the data by using a portion of the column address associated with the data. In some embodiments, one bit of metadata may be associated with each cache line or prefetch. In some embodiments, the GCR plane may store sixty-four bits of metadata.

In some applications, storing metadata in the GCR plane may reduce or eliminate loss of memory array space for storing data. In some applications, adding columns to the GCR plane may incur less of a space and cost penalty than when metadata is stored in the data portion of the memory array. In some applications, storing metadata in the GCR plane may allow data and metadata to be accessed in a single pass rather than in two passes.

FIG. 1 is a block diagram of at least a portion of a computing system according to some embodiments of the present disclosure. The computing system 100 includes a memory module 102 and a controller 106 in communication with the memory module 102. In some embodiments, the controller 106 may be included in a processor (not shown)

or in communication with the processor. The memory module 102 may include one or more memory devices 104. In the example shown in FIG. 1, there are eight memory devices 104(0-7). However, in other embodiments, there may be more or fewer memory devices. In some embodiments, additional memory devices 104 may be included to provide for redundancy. In some embodiments, memory module 102 may be a dual in-line memory module (DIMM). In some embodiments, what is shown in FIG. 1 may represent only half of the DIMM (e.g., one of the two channels).

The controller 106 may provide commands, addresses, and/or data (e.g., data, metadata, or both) to one or more of the memory devices 104 and receive data from one or more of the memory devices 104. In some embodiments, memory devices 104 may be x4 or x8 memory devices. That is, either four or eight DQ terminals (e.g., pins) may be active. In some embodiments, the memory devices 104 may support both x4 and x8 operation. In some embodiments, whether the memory devices 104 operate in x4 or x8 mode may be based, at least in part, on values stored in mode registers (not shown in FIG. 1) of the memory devices 104.

In some applications, each of the memory devices 104 may provide four bits of metadata, for a total of four bytes of data. Where memory density is a priority, according to embodiments of the present disclosure, each memory device 104 may provide one bit of metadata. In some applications, only four bits of metadata are desired. However, where memory module 102 includes eight memory devices 104, an addressing issue arises as each memory device 104 cannot store half a bit.

According to embodiments of the present disclosure, only certain ones of the memory devices 104 provide metadata based, at least in part, on a column address (e.g., CA<11:0>) provided by the controller 106. For example, when a portion of the column address is one value, memory devices 104 (0-3) may provide metadata, and when the certain portion of the column address is another value, memory devices 104 (4-7) may provide metadata. In some embodiments, which value of the portion of the column address for which the memory device 104 provides metadata may be based, at least in part, on a value stored in the mode register of the memory device 104. In some embodiments, the mode register may be programmed (e.g., written to) with the value by the controller 106. In some embodiments, the controller 106 may be configured to ignore metadata provided from one or more of the memory devices 104(0-7) based on the portion of the column address. In some examples, the portion of the column address may include CA10. Using a portion of the column address to determine which memory devices provide metadata and/or which metadata is ignored may reduce addressing and/or data management issues when a number of metadata bits desired is less than a total number of memory devices.

As will be described in more detail herein, memory device 104 may include a memory array including one or more banks organized into multiple column planes. Each of the column planes may be associated with multiple column selects. One or more of the banks may include a GCR plane for repairing defective columns. The GCR plane may further include columns for storing metadata. The columns for the metadata may receive column selects. The metadata may be associated with the data (e.g., a pointer, poison bit, etc.). In order to properly associate the metadata stored in a location of the GCR plane with the data stored in the "regular" column planes, the metadata may be mapped (e.g., assigned addresses) based on the column address of the data.

According to embodiments of the present disclosure, a portion of the column address may be used to generate a metadata address to map the metadata to the appropriate data. In some embodiments, the metadata address may be based on six bits of the column address. In some embodiments, the metadata address may be generated by a GCR circuit. In some embodiments, the address may be generated by the mode register.

Figure 2:
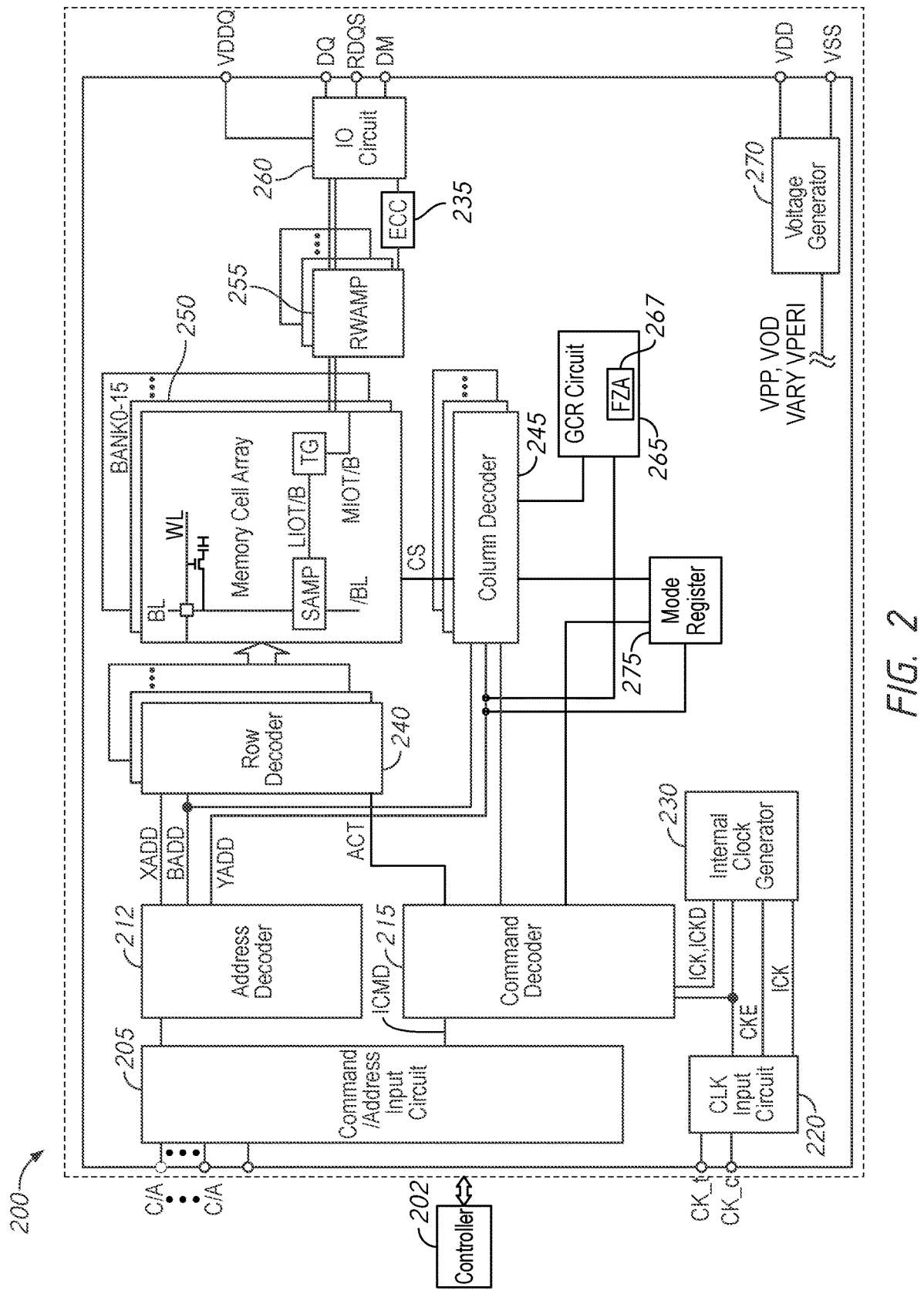
FIG. 2 is a block diagram of a semiconductor device according to some embodiments of the present disclosure.

FIG. 2 is a block diagram of a semiconductor device according to some embodiments of the present disclosure. The apparatus may be a semiconductor device 200, and will be referred as such. In some embodiments, the semiconductor device 200 may include, without limitation, a dynamic random access (DRAM) device integrated into a single semiconductor chip. In some examples, the DRAM may be a double data rate (DDR) memory. In some embodiments, one or all of the memory devices 104(0-7) may include semiconductor device 200.

The semiconductor device 200 includes a memory die. The die may be mounted on an external substrate, for example, a memory module substrate, a mother board or the like (e.g., package-on-package (PoP)). The semiconductor device 200 may further include a memory array 250. The memory array 250 includes a plurality of banks BANK0-15, each bank including a plurality of word lines WL, a plurality of bit lines BL, and a plurality of memory cells MC arranged at intersections of the plurality of word lines WL and the plurality of bit lines BL. Although sixteen banks are shown in FIG. 2, memory array 250 may include any number of banks. The selection of the word line WL is performed by a row decoder 240 and the selection of the bit line BL is performed by a column decoder 245. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches. The TG may be coupled to one or more read/write amplifiers (RWAMP) 255, which may be coupled to an error correction code (ECC) circuit 235. The ECC circuit 235 may be coupled to an IO circuit 260, which may be coupled to one or more external terminals of semiconductor device 200. Read data from the bit line BL is amplified by the sense amplifier SAMP, and transferred to read/write amplifiers 255 over complementary local data lines (LIOT/B), transfer gate (TG), and complementary main data lines (MIOT/B) to the ECC circuit 235. Conversely, write data outputted from the ECC circuit 235 is transferred to the sense amplifier SAMP over the complementary main data lines MIOT/B, the transfer gate TG, and the complementary local data lines LIOT/B, and written in the memory cell MC coupled to the bit line BL.

The semiconductor device 200 may employ a plurality of external terminals that include command and address terminals coupled to a command/address (C/A) bus to receive command and address signals, clock terminals to receive clock signals CK_t and CK_c, data terminals DQ, RDQS, and power supply terminals VDD, VSS, VDDQ, and VSSQ.

The C/A terminals may be supplied with an address and a bank address signal from outside, for example, from a controller 202. The address signal and the bank address signal supplied to the address terminals are transferred, via a command/address input circuit 205, to an address decoder 212. The address decoder 212 receives the address signals and supplies a decoded row address signal XADD to the row decoder 240, and a decoded column address signal YADD to the column decoder 245. The address decoder 212 also receives the bank address signal BADD and supplies the bank address signal to the row decoder 240 and the column decoder 245.

The C/A terminals may further be supplied with command signals from, for example, a controller 202. In some embodiments, controller 202 may be implemented or included in controller 106. The command signals may be provided as internal command signals ICMD to a command decoder 215 via the command/address input circuit 205. The command decoder 215 includes circuits to decode the internal command signals ICMD to generate various internal signals and commands for performing operations, for example, a row activation signal (ACT) to select a word line and a column select signal (CS) (or referred to simply as column selects) to select one or more bit lines. Another example may be providing internal signals to enable circuits for performing operations, such as control signals to enable signal input buffers that receive clock signals. The internal commands also include output and input activation commands.

In some embodiments, each bank BANK0-15 may be organized into multiple column planes. Each column plane may be associated with multiple column selects (e.g., CS0-63). Data located in columns associated with a column select may be accessed by activation of the appropriate column select by the column decoder. Which column select is activated may be based on the column address YADD provided by the address decoder 212. In some embodiments, the semiconductor device 200 further includes a global column redundancy (GCR) circuit 265 that may facilitate repair operations of defective columns within the column planes. The GCR circuit 265 may "replace" a defective column of a column plane with an "extra" or "redundant" column in a GCR plane of a bank. The defective column may be replaced by remapping the address (which may include a portion of the address indicating the column select) of the column to an address of a column in the GCR plane.

In some embodiments, the GCR circuit 265 may include a fuse array (FZA) 267, which may contain non-volatile storage elements (fuses or anti-fuses) which may store information about addresses in the memory array 250. Each fuse may start in a first state (e.g., an anti-fuse may be insulating), and may be 'blown' to permanently change the fuse's state (e.g., a blown anti-fuse may be conductive). For ease of reference, the term 'fuse' may be used to refer to any non-volatile storage element. Each fuse may be considered to be a bit, which is in one state before it is blown, and permanently in a second state after it's blown. For example, a fuse may represent a logical low before it is blown and a logical high after it is blown. Groups of fuses may store a binary signal which may be used to control and/or alter operations of the memory. For example, the fuse array 267 includes repair information that remaps defective columns to redundant columns. For example, the fuse array 267 may encode a repair address which specifies the defective column that is repaired and the redundant column used to repair the defective column.

The address information in the fuse array 267 may be 'scanned' by the GCR circuit 265. While shown as a separate component in FIG. 2, the GCR circuit 265 may be part of column decoder 245 in some embodiments. The GCR circuit 265 may receive the column address YADD of a column which is being accessed. If the column address YADD matches a repair address, then the GCR circuit 265 may direct the column decoder 245 to access a redundant column in a GCR plane rather than the column originally associated with the address YADD. For example, if the column address YADD would normally be associated with a first value of the CS signal, the GCR circuit 265 may direct the column decoder 245 to activate a redundant CS signal (RCS) of a GCR plane.

According to embodiments of the present disclosure, in addition to including redundant columns used for repairs, the GCR plane may include columns associated with redundant column selects (RCS) for storing metadata. In some embodiments, the GCR plane may include eight columns, each associated with a RCS to store metadata. In some embodiments, one bit of metadata may be stored and associated with one cache line or prefetch of data stored in the column planes of a bank. In some embodiments, sixty-four bits of metadata may be stored in the GCR plane. In some embodiments, the GCR circuit 265 may map the metadata to the data by generating a metadata address based, at least in part, on the column address of the data. In some embodiments, the mapping information may be stored in the fuse array 267.

In some embodiments, the data and the metadata may be accessed by a "two-pass" method. For example, during a read operation, the metadata may be accessed in a first pass by activating the column select associated with the metadata, and the data may be accessed in a second pass by activating the column select associated with the data. In some embodiments, the metadata may be stored the array 250 and/or a buffer outside the array (not shown) while the data is accessed. This may reduce storage needs in embodiments where there is less metadata than data per access operation. The metadata and data may be concatenated prior to being output by the semiconductor device 200. For example, the metadata may be appended to the front or the back of the data (e.g., it is output first or last from the semiconductor device 200, respectively).

In some embodiments, the data and metadata may be accessed by a "one-pass" method. When the GCR plane is not being used to repair a column associated with a column select associated with an access operation, the GCR plane and associated redundant column selects are idle. In these instances, the column select associated with the data and the redundant column select associated with the metadata may be activated simultaneously or near simultaneously, allowing the data and the metadata to be accessed in a single pass. Similar to the two-pass method, the metadata and data may be concatenated prior to being output by the semiconductor device 200.

The C/A terminals may receive an access command which is a read command. When a read command is received, and a bank address, a row address and a column address are timely supplied with the read command, a codeword including read data, metadata, and read ECC data (e.g., parity bits) is read from memory cells in the memory array 250 corresponding to the row address and column address. The read command is received by the command decoder 215, which provides internal commands so that read data from the memory array 250 is provided to the ECC circuit 235. The ECC circuit 235 may use the parity bits in the codeword to determine if the codeword includes any errors, and if any errors are detected, may correct them to generate a corrected codeword (e.g., by changing a state of the identified bit(s) which are in error). The corrected codeword (without the parity bits) is output from the data terminals DQ via the input/output circuit 260.

The C/A terminals may receive an access command which is a write command. When the write command is received, and a bank address, a row address, and a column address are timely supplied as part of the write operation, and write data is supplied through the DQ terminals to the ECC circuit 235.

The write data (which may include write data and metadata) supplied to the data terminals DQ is written to a memory cells in the memory array 250 corresponding to the row address and column address. The write command is received by the command decoder 215, which provides internal commands so that the write data is received by data receivers in the input/output circuit 260. The write data is supplied via the input/output circuit 260 to the ECC circuit 235. The ECC circuit 235 may generate ECC data (e.g., a number of parity bits) based on the write data, and the write data and the parity bits may be provided as a codeword to the memory array 250 to be written into the memory cells MC.

The command decoder 215 may access mode register 275 that is programmed with information for setting various modes and features of operation for the semiconductor device 200. For example, the mode register 275 may provide parameters that allow the semiconductor device 200 to operate at different frequencies, provide different burst lengths, allow banks BANK0-15 to be organized into different groups, operate in ×4, ×8, or ×16 mode, and/or other different operating conditions. In some embodiments, mode register 275 may include multiple registers.

The information in the mode register 275 may be programmed by providing the semiconductor device 200 a mode register write command, which causes the semiconductor device 200 to perform a mode register write operation. In some embodiments, data to be written to the mode register 275 is provided via the C/A terminals and/or the DQ terminals. The command decoder 215 accesses the mode register 275, and based on the programmed information along with the internal command signals provides the internal signals to control the circuits of the semiconductor device 200 accordingly. Information programmed in the mode register 275 may be externally provided by the semiconductor device 200 using a mode register read command, which causes the semiconductor device 200 to access the mode register 275 and provide the programmed information (e.g., to the memory controller 202). In some embodiments, the information may be provided via the C/A terminals and/or the DQ terminals.

Optionally, the mode register 275 may be programmed with a value that determines whether or not the semiconductor device 200 stores metadata. In some embodiments, this value may be stored in a different register of the mode register than the register that stores the value determining when metadata is provided by the semiconductor device 200. When one value is stored in the register, no metadata may be stored. When another value is stored in the register, metadata may also be stored.

In some embodiments, when semiconductor device 200 is programmed to store metadata, mode register 275 may generate an address for the metadata. In some embodiments, the metadata address may be based, at least in part, on the column address. In some embodiments, only some of the bits of the column address may be used to generate the metadata. The metadata address may be provided from the mode register 275 to the column decoder 245. The address provided by the mode register 275 may allow the metadata associated with the data indicated by the column address to be read from and/or written to the correct location in the memory array 250. In some embodiments, the mode register 275 may generate the address for access operations instead of the GCR circuit 265. In other embodiments, the mode register 275 may be used to program the address information in the GCR circuit 265 (e.g., programming metadata address information in fuse array 267). In other embodiments, metadata address operations may be omitted from the mode register, and metadata address handling may be performed by the GCR circuit 265.

Turning to the explanation of the external terminals included in the semiconductor device 200, the clock terminals and data clock terminals are supplied with external clock signals and complementary external clock signals. The external clock signals CK_t, CK_c may be supplied to a clock input circuit 220. When enabled, input buffers included in the clock input circuit 220 pass the external clock signals. For example, an input buffer passes the CK_t and CK_c signals when enabled by a CKE signal from the command decoder 215. The clock input circuit 220 may use the external clock signals passed by the enabled input buffers to generate internal clock signal ICK. The internal clock signal ICK are supplied to internal clock circuit 230 for providing one or more clock signals to the various components of semiconductor device 200.

The internal clock circuits 230 includes circuits that provide various phase and frequency controlled internal clock signals based on the received internal clock signals. For example, the internal clock circuits 230 may include a clock path (not shown in FIG. 2) that receives the ICK clock signal and provides internal clock signals ICK and ICKD to the command decoder 215. Optionally, the input/output circuit 260 may include clock circuits and driver circuits for generating and providing the RDQS signal to a controller.

The power supply terminals are supplied with power supply potentials VDD and VSS. These power supply potentials VDD and VSS are supplied to an internal voltage generator circuit 270. The internal voltage generator circuit 270 generates various internal potentials VPP, VOD, VARY, VPERI, and the like and a reference potential ZQVREF based on the power supply potentials VDD and VSS. The internal potential VPP is mainly used in the row decoder 240, the internal potentials VOD and VARY are mainly used in the sense amplifiers included in the memory array 250, and the internal potential VPERI is used in many other circuit blocks.

The power supply terminal is also supplied with power supply potential VDDQ. The power supply potentials VDDQ is supplied to the input/output circuit 260 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 260 so that power supply noise generated by the input/output circuit 260 does not propagate to the other circuit blocks.

Figure 3:
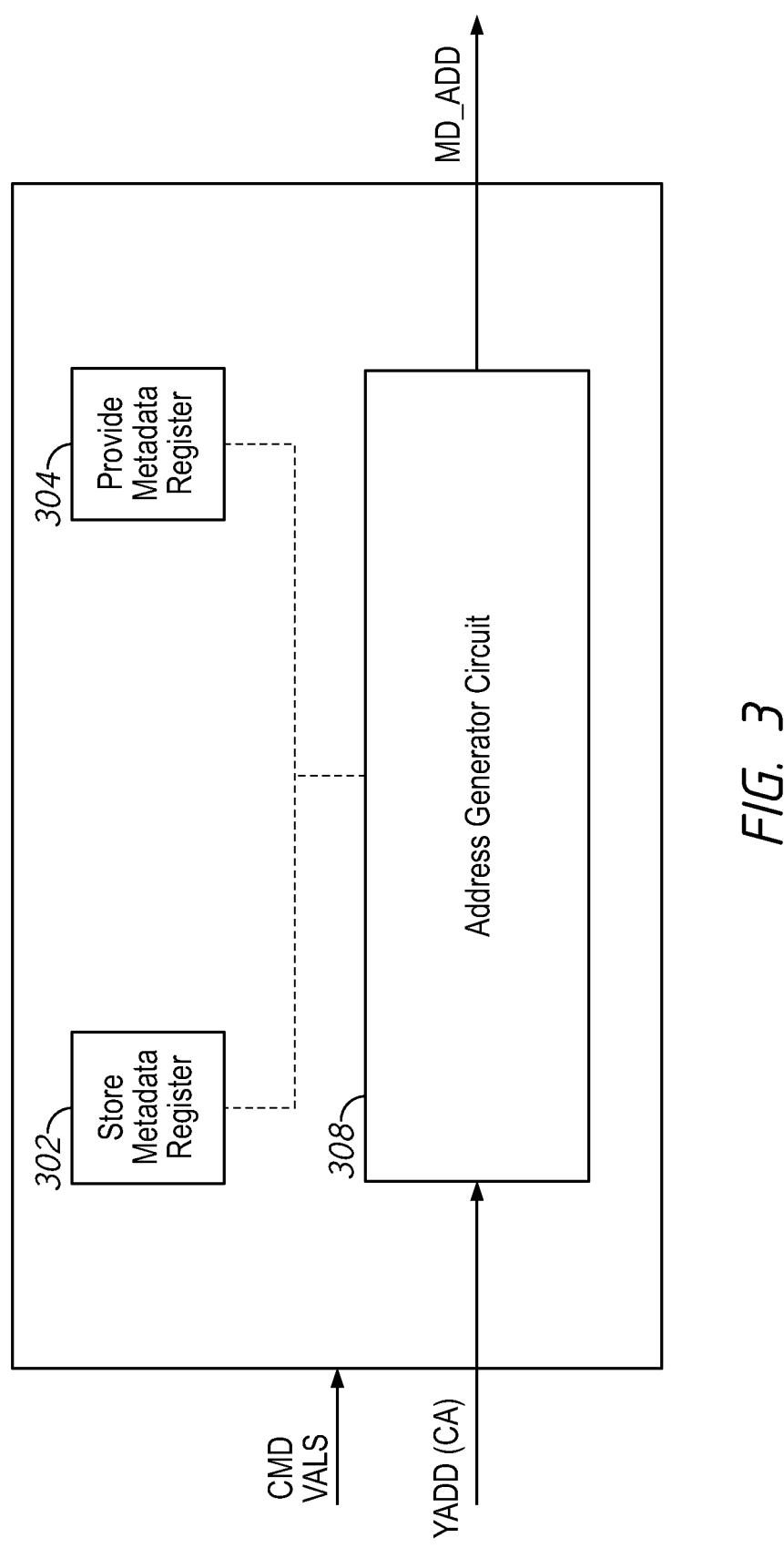
FIG. 3 is a block diagram of a mode register according to an embodiment of the present disclosure.

FIG. 3 is a block diagram of a mode register according to an embodiment of the disclosure. In some embodiments, mode register 300 may be included in mode register 275 shown in FIG. 2. In the example shown in FIG. 3, mode register 300 includes two registers 302 and 304. However, mode register 300 may include any number of registers, each of which may store one or more values for various operating parameters of a device, such as semiconductor device 200.

Mode register 300 may receive commands and values. The commands may indicate register read or write commands and which register 302, 304 is to be read or written to. The values may indicate, for a mode register write command, the value to be written to the register targeted by the mode register write command. The commands and values may be received from a command decoder, such as command decoder 215.

Register 302 may be programmed with a value that indicates whether or not a device including mode register 300 should store metadata. For example, if a '0' is stored in register 302, the device may not store metadata and if a '1' in register 302 is stored, the device may store metadata. In some embodiments, register 302 may be omitted, and the device may always store metadata.

Register 304 may be programmed with a value that indicates when the device provides metadata. For example, if a '0' is stored in register 304, the device may provide metadata when a portion of the column address (which may be indicated by YADD or CA) is a first state and not provide metadata when a portion of the column address is a second state. For example, the device may provide metadata when CA10 of the column address is '0' and not provide metadata when CA10 is '1.' If a '1' is stored in register 304, the device may provide metadata when the portion of the column address is the second state and not provide metadata when the portion of the column address is the first state. For example, the device may provide metadata when CA10 of the column address is '1' and not provide metadata when CA10 is '0.' In some embodiments, register 304 may be disabled or omitted, for example, when the semiconductor device is operating in x8 mode.

In embodiments where the mode register 300 handles metadata addressing, mode register 300 may receive a column address YADD (or CA). The column address may be provided by an address decoder, such as address decoder 212. The column address may be provided to an address generator circuit 308. The address generator circuit 308 may generate the metadata address (MD_ADD) associated with the appropriate metadata based, at least in part, on the column address. The addresses may be provided to a column decoder, such as column decoder 245 and/or GCR circuit, such as GCR circuit 265. In some embodiments, the column address is multiple bits (e.g., 12 bits), and the metadata address is based on less than all of the bits of the column address (e.g., 6 bits, 7 bits). In some embodiments, the address generator circuit 308 may include one or more logic circuits (not shown) that generate the address(s) based on a mapping of data stored in the memory array to the metadata stored in the memory array.

Optionally, in some embodiments, the address generator circuit 308 may be enabled or disabled based on values stored in registers 302 and 304. For example, the address generator circuit 308 may be disabled if the value in register 302 indicates no metadata is stored. In a further example, the address generator circuit 308 may flip one or more bits of the column address when generating the addresses based on the value stored in register 304. In some examples, this may ensure the device responds consistently regardless of which mode is indicated by the value stored in register 304.

Figure 4:
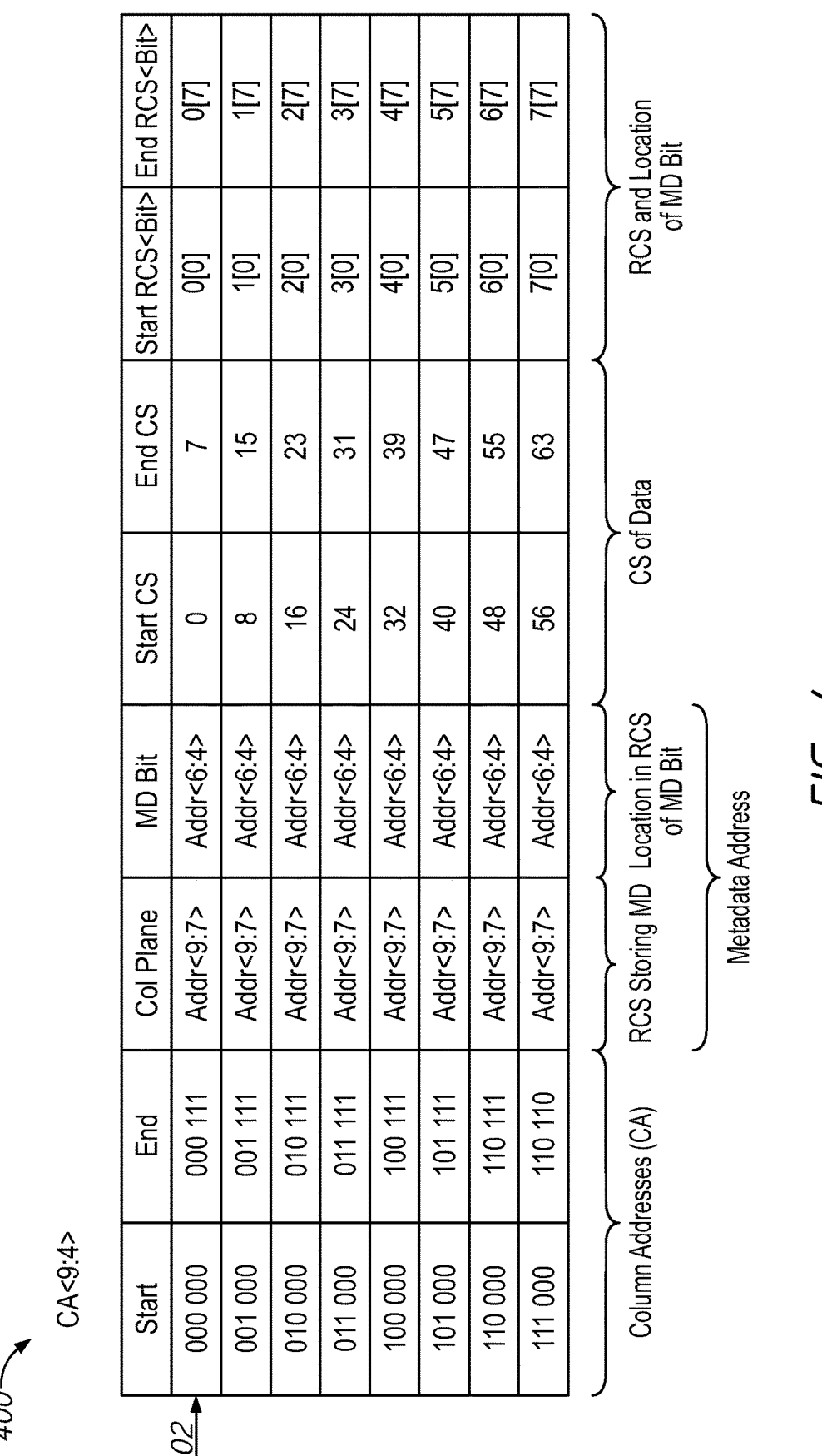
FIG. 4 is an example of a mapping of metadata to data according to an embodiment of the present disclosure.

FIG. 4 is an example of a mapping of metadata to data according to an embodiment of the present disclosure. In some embodiments, the mapping 400 may be implemented by a mode register, such as mode register 300 or a GCR circuit, such as GCR circuit 265. The mapping 400 maps one bit of metadata to one cache line or prefetch of data.

The full column address (e.g., CA<11:0>) indicates the location of the data to be accessed (e.g., where data is to be read from or written to in the memory array). The metadata address may be generated based on the column address. In some embodiments, not all of the bits of the column address are used to generate the metadata address. In the example mapping, CA<9:4> are used to generate the metadata address. The first two columns of mapping 400 provide ranges of the column addresses for CA<9:4>. The ranges are labelled "Start" and "End." For example, the first row indicated by arrow 402 provides the mapping for column addresses having CA<9:4> from 000000 to 000111.

The next two columns of mapping 400 indicate the metadata address. The metadata address includes CA<9:4> of the column address. That is, the metadata address is six bits and corresponds to the ninth through fourth bits of the column address. CA<9:7> provides the address for which redundant column select (RCS) may be activated to access the metadata associated with the data. There are sixty-four column selects (CS) associated with the data stored in the column planes of the memory array. When one bit of metadata is associated with each cache line or prefetch, sixty-four bits of metadata are stored. Eight redundant columns, each including eight bits, may be used to store the metadata. Each redundant column may be accessed by a different RCS. Accordingly, three bits may be used to indicate the RCS of the metadata. CA<6:4> provide the location within the redundant column of the bit of metadata associated with the data. As explained previously, each redundant column provides eight bits responsive to a redundant column select signal. Thus, three bits are used to indicate which of the eight bits of metadata is associated with the data at the column address.

The "Start CS" and "End CS" indicate the range of column selects for the data associated the column addresses in the first two columns. For example, in the row indicated by arrow 402, column selects 0-7 are associated with CA<9: 4> from 000000 to 000111. These column selects are associated with the data stored in the memory array. The final two columns indicates the redundant column selects and bit locations for the metadata associated with the data for column selects in the given range. In the row indicated by arrow 402, the eight bits of metadata stored in a redundant column associated with RCS is associated with the data of CS 0-7 (e.g., bit 0 is associated with the data of CS0 and bit 7 is associated with the data of CS7).

The mapping 400 is provided merely as an example, and other mappings may be used without exceeding the scope of the present disclosure. For example, more or fewer bits of the column address may be used to generate the metadata address. As another example, different columns associated with different RCS may be mapped to the data. The mapping of metadata to data and generating of metadata addresses based on the mapping may be implemented by a mode register and/or a GCR circuit in some embodiments.

Figure 5:
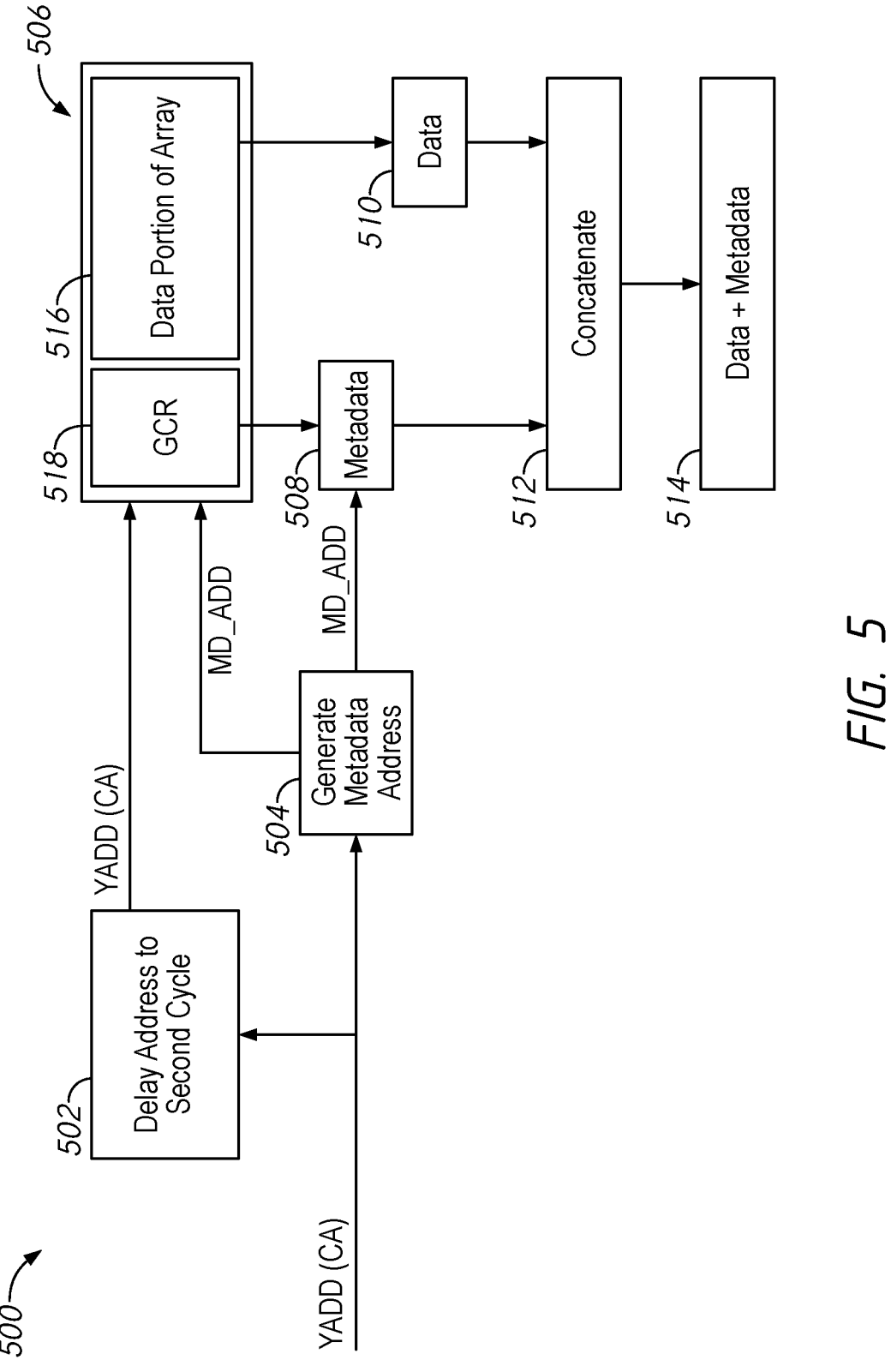
FIG. 5 is a flow diagram illustrating a two-pass memory access operation according to an embodiment of the present disclosure.

FIG. 5 is a flow diagram illustrating a memory access operation according to an embodiment of the present disclosure. In some embodiments, the access operation shown in flow diagram 500 may be performed by memory device 104 and/or semiconductor device 200.

When the memory access operation is a two-pass operation, when a column address YADD (or CA) indicating a location of data to be accessed in a data portion of a memory array, it may be delayed prior to being provided to a column decoder (e.g., a delay circuit, a buffer, etc.) as indicated by block 502. The column address may be used (e.g., by a mode register and/or GCR circuit) to generate a metadata address (e.g., based on mappings such as mapping 400) as indicated by block 504. All or a portion of metadata address MD_ADD may be provided to a column decoder to cause a GCR plane 518 of the array indicated by block 506 to provide metadata indicated by 508. Activating the redundant column select for the metadata may cause more than one bit of metadata to be provided from the GCR plane 518. The metadata address MD_ADD may further be used to select which of the bit or bits of the metadata provided from the GCR plane 518 corresponds to the data associated with the column address. The "extra" metadata provided may be ignored or discarded. The selected metadata may be held in the array 506, register, buffer, or other storage area. After the metadata has been accessed, the delayed column address is provided to the column decoder to cause the data portion 516 of array 506 to provide the data as indicated by block 510. The data and metadata may be concatenated as indicated by block 512. The combined data and metadata indicated by block 514 may then be provided (e.g., via an IO circuit to DQ pins).

In some embodiments, the memory access operation may be a single-pass operation. This may occur, for example, when the GCR plane 518 is not used to repair a column associated with the received column address. In these embodiments, block 502 may be omitted, and the column address and the metadata address may be provided to the array 506 to cause the array 506 to provide the metadata from the GCR plane 518 and the data from the data portion 516 of the array 506 in one pass (e.g., concurrently or near-concurrently). In the single-pass operation, the data and metadata may be concatenated and output as shown by blocks 512 and 514, similar to the two-pass method.

In some embodiments, a memory device may be capable of determining "on the fly" whether to perform a one pass or two pass memory access operation. For example, memories where access operations do not have deterministic delays (e.g., CXL memories). In these embodiments, a GCR circuit may determine whether a column of the column address is repaired by the GCR plane. If the GCR circuit determines a repair is not associated with the column address, the memory may perform a one-pass operation. If the GCR circuit determines a repair is associated with the column address, the memory may perform a two-pass operation.

FIG. 6 is a flow chart of a method according to an embodiment of the present disclosure. In some embodiments, the method 600 may be performed, at least in part, by a device (e.g., memory device 104, semiconductor device 200) and/or a computing system, such as computing system 100.

At block 602, "receiving a column address at a memory device" may be performed. In some embodiments, the column address may be received by an address decoder, such as address decoder 212. In some embodiments, the column address may be received as part of a larger address (e.g., including bank and row address portions). The command address may be provided to other components of the memory device in some embodiments, such as a column decoder, a mode register, and/or a global column redundancy (GCR) circuit.

At block 604 "generating a metadata address based on a portion of the column address" may be performed. In some embodiments, the metadata address may be generated by a mode register and/or GCR circuit. In some embodiments, the metadata address may be generated based on a mapping, such as mapping 400. In some embodiments, the metadata address may be generated based on programming of a fuse array, such as fuse array 267. In some embodiments, the fuse array may be programmed based on a mapping. In some embodiments, the GCR circuit and/or fuse array may be programmed by the mode register. In some embodiments, the portion of the column address used to generate the metadata address is less than an entirety of the column address. In some embodiments, generating the metadata address comprises selecting fourth through ninth bits of the column address as the metadata address.

At block 606 "retrieving from a GCR plane of a memory array of the memory device, metadata associated with the metadata address" may be performed. For example, GCR plane 518 shown in FIG. 5. In some embodiments, eight bits of metadata may be retrieved at a time. In some embodiments, only one bit of the eight may be selected and the remaining bits may be discarded or ignored.

At block 608 "retrieving from a column plane of the memory array, data associated with the column address" may be performed. In some embodiments, the data is retrieved after the metadata.

At block 610 "providing, from the memory device, the data and the metadata" may be performed. In some embodiments, the metadata and data may be concatenated prior to being provided externally from the memory device. In some embodiments, the metadata is concatenated to an end of the data.

Optionally, method 600 may further include determining, based on the column address, whether a column of the column plane associated with the column address is repaired by the GCR plane. When the column of the column plane is not repaired, retrieving the metadata and the data in a single pass, and when the column of the column plane is repaired, retrieving the metadata and the data in two passes. When the two-pass method is used, in some embodiments, the metadata may be access first in a first pass and the data may be accessed second in a second pass.

EXAMPLES OF THE PRESENT DISCLOSURE

In some examples, an apparatus may comprise a memory array comprising a plurality of column planes configured to store data and a global column redundancy (GCR) plane configured to repair defective columns of the plurality of column planes and store metadata associated with the data.

In some examples of the apparatus, the GCR plane comprises eight columns configured to store the metadata. In some examples, each of the columns is associated with a different redundant column select.

In some examples, the apparatus further comprises a GCR circuit configured to generate a metadata address indicating a location of the metadata associated with the data. In some examples, the GCR circuit comprises a fuse array, wherein the metadata addresses are stored in the fuse array.

In some examples, the apparatus further comprises a mode register configured to generate a metadata address indicating a location of the metadata address associated with the data. In some examples, the metadata address is based, at least in part, on a column address associated with the data. In some examples, the metadata address is based on six bits of the column address. In some examples, three of the six bits indicate a redundant column select and another three of the six bits indicates a location of a metadata bit in a redundant column of the redundant column select.

In some examples of the apparatus, the GCR plane comprises a plurality of columns, wherein a first portion of the plurality of columns are configured to repair the defective columns of the plurality of column planes and a second portion of the plurality of columns are configured to store the metadata, wherein the first portion and second portion are different.

In some examples of the apparatus, the GCR plane stores one bit of metadata for each cache line or prefetch of the data stored in the plurality of column planes.

In some examples, a method may include receiving a column address at a memory device; generating a metadata address based on a portion of the column address; retrieving from a global redundancy (GCR) plane of a memory array of the memory device, metadata associated with the meta-data address; retrieving from a column plane of the memory array, data associated with the column address; and providing, from the memory device, the data and the metadata.

In some examples of the method, the data is retrieved after the metadata.

In some examples, the method further includes concatenating the metadata and the data. In some examples, the metadata is concatenated to an end of the data.

In some examples of the method, the metadata address is generated by a mode register of the memory device.

In some examples of the method, the portion is less than an entirety of the column address. In some examples, generating the metadata address comprises selecting fourth through ninth bits of the column address as the metadata address.

In some examples of the method, the metadata address is generated by a global column redundancy circuit. In some examples, the metadata address is generated by a fuse array of the global column redundancy circuit.

In some examples of the method, the metadata comprises one bit.

In some examples, the method further comprises determining, based on the column address, whether a column of the column plane associated with the column address is repaired by the GCR plane; when the column of the column plane is not repaired, retrieving the metadata and the data in a single pass; and when the column of the column plane is repaired, retrieving the metadata and the data in two passes. In some examples, when the metadata is retrieved in a first pass of the two passes and the data is retrieved in a second pass of the two passes.

In some examples, a system may comprise a plurality of memory devices each comprising: a memory array comprising a plurality of column planes configured to store data and a global column redundancy (GCR) plane configured to repair defective columns of the plurality of column planes and store metadata associated with the data.

In some examples of the system, each of the plurality of memory devices is configured to provide one bit of metadata per cache line or prefetch.

In some examples of the system, the memory array comprises a bank comprising the plurality of column planes and the GCR plane. In some examples, the plurality of column planes of the bank comprises sixteen column planes. In some examples, each of the plurality of column planes receives sixty-four column selects.

In some examples of the system, the GCR plane comprises a plurality of columns configured to store the meta-data, each of the plurality of columns associated with a different one of a plurality of redundant column selects. In some examples, each of the plurality of columns is configured to store eight bits of metadata. In some examples, the plurality of columns comprises eight columns.

In some examples of the system, each of the plurality of memory devices further comprises a global redundancy circuit configured to generate a metadata address for the metadata associated with the data.

In some examples of the system, each of the plurality of memory devices further comprises a mode register circuit configured to generate a metadata address for the metadata associated with the data.

In some examples, the system may further comprise a controller configured to provide a column address to the plurality of memory devices and receive the data corresponding to the column address and the metadata corresponding to the data. In some examples, the controller is further configured to provide a read command.

The apparatuses, systems, and methods disclosed herein may allow for efficient storage of metadata. In some applications, the addressing of the metadata disclosed herein may minimize impacts on the time between an internal read and when the data is provided from the array (tAA). In some applications, the apparatuses, systems, and methods disclosed herein may allow for both two-pass and one-pass memory access operations.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:
1. An apparatus comprising:
a memory array comprising:

a plurality of column planes configured to store data, and
a global column redundancy (GCR) plane configured to repair defective columns of the plurality of column planes and store metadata associated with the data, wherein the GCR plane comprises a plurality of columns, wherein a first portion of the plurality of columns are configured to repair the defective columns of the plurality of column planes and a second portion of the plurality of columns are configured to store the metadata, wherein the first portion and second portion are different.

2. The apparatus of claim 1, wherein the GCR plane comprises eight columns configured to store the metadata, wherein each of the columns is associated with a different redundant column select.

3. The apparatus of claim 1, further comprising a GCR circuit configured to generate a metadata address indicating a location of the metadata associated with the data.

4. The apparatus of claim 3, wherein the GCR circuit comprises a fuse array, wherein the metadata addresses are stored in the fuse array.

5. The apparatus of claim 1, further comprising a mode register configured to generate a metadata address indicating a location of the metadata address associated with the data.

6. The apparatus of claim 5, wherein the metadata address is based, at least in part, on a column address associated with the data.

7. The apparatus of claim 6, wherein the metadata address is based on six bits of the column address, wherein three of the six bits indicate a redundant column select and another three of the six bits indicates a location of a metadata bit in a redundant column of the redundant column select.

8. The apparatus of claim 1, wherein the GCR plane stores one bit of metadata for each cache line or prefetch of the data stored in the plurality of column planes.

* * * * *